(12) United States Patent
Sumita et al.

(10) Patent No.: US 7,094,844 B2
(45) Date of Patent: Aug. 22, 2006

(54) LIQUID EPOXY RESIN COMPOSITION AND SEMICONDUCTOR DEVICE

(75) Inventors: Kazuaki Sumita, Gunma-ken (JP); Shingo Ando, Gunma-ken (JP); Toshio Shiobara, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 337 days.

(21) Appl. No.: 10/659,266

(22) Filed: Sep. 11, 2003

(65) Prior Publication Data

US 2004/0054061 A1   Mar. 18, 2004

(30) Foreign Application Priority Data

Sep. 13, 2002   (JP) .............................. 2002-268755

(51) Int. Cl.
C08K 3/36 (2006.01)
C08L 61/14 (2006.01)
C08L 63/00 (2006.01)
C08L 63/02 (2006.01)

(52) U.S. Cl. ...................... 525/490; 523/428; 523/445; 523/457; 523/466; 525/474; 525/476; 525/486; 525/507; 525/523; 525/524

(58) Field of Classification Search ...................... None
See application file for complete search history.

(56) References Cited

U.S. PATENT DOCUMENTS 3,786,025 A * 1/1974 Freeman et al. ............ 525/495
4,476,277 A * 10/1984 Koyama et al. ............ 524/509
6,479,167 B1 * 11/2002 Sumita et al. .............. 428/620

FOREIGN PATENT DOCUMENTS

| JP | 58-109525 A | * | 6/1983 |
| JP | 09-31406 A | * | 2/1997 |
| JP | 10-158366 | | 6/1998 |
| JP | 3238340 B2 | | 10/2001 |
| SU | 358335 A | * | 11/1972 |
| SU | 687034 A | * | 9/1979 |
| SU | 887595 A | * | 11/1981 |
| SU | 896033 A | * | 1/1982 |
| SU | 896035 A | * | 1/1982 |
| SU | 1004411 A | * | 3/1983 |

OTHER PUBLICATIONS

CAPLUS accession No. 1973:17719 for Lapitskii et al., Elektrotekhnika, vol. 5, 1972, abstract.*

* cited by examiner

*Primary Examiner*—Robert Sellers
(74) *Attorney, Agent, or Firm*—Birch, Stewart, Kolasch & Birch, LLP

(57) ABSTRACT

A liquid epoxy resin composition comprising a liquid epoxy resin, an aromatic amine curing agent having a phenolic hydroxyl group in a skeleton, an inorganic filler, and a cure accelerator is useful for semiconductor encapsulation. The composition is adherent to the surface of silicon chips, does not deteriorate under hot humid conditions, and is fully resistant to thermal shocks.

6 Claims, 1 Drawing Sheet

LIQUID EPOXY RESIN COMPOSITION AND SEMICONDUCTOR DEVICE

This invention relates to a liquid epoxy resin composition for semiconductor encapsulation, and more particularly, to a liquid epoxy resin composition which has improved adhesion to the surface of silicon chips and especially photosensitive polyimide resins, nitride films and oxide films, and cures into a product having improved resistance to humidity, to thermal shocks at high temperatures above the reflow temperature of 260° C., and to thermal cycling, and is thus suitable as encapsulation material. It also relates to a semiconductor device which is encapsulated with the liquid epoxy resin composition.

BACKGROUND OF THE INVENTION

The trend toward smaller sizes, lighter weights and increased capabilities in electrical equipment has led to a shift in the dominant semiconductor mounting process from pin insertion to surface mounting. Progress of semiconductor devices toward a higher degree of integration entails the enlargement of dies to a size as large as 10 mm or more per side. For semiconductor devices using such large size dies, greater stresses are applied to the die and the encapsulant during solder reflow or in an environment of cycling between −65° C. and 150° C. Such stresses are deemed problematic because separation occurs at the interface between the encapsulant and the die or substrate, and the package cracks.

From the expectation that the use of leaded solders will be banned in the near future, a number of lead-substitute solders have been developed. Since most substitute solders have a higher melting temperature than the leaded solders, it has been considered to carry out reflow at temperatures of 260 to 270° C. At such reflow temperatures, more failures are expected with encapsulants of prior art liquid epoxy resin compositions. Even with flip chip type packages which have raised no substantial problems in the prior art, the reflow at such high temperatures brings about serious problems that cracks can occur during the reflow and the encapsulant can peel at interfaces with chips or substrates.

SUMMARY OF THE INVENTION

An object of the invention is to provide a liquid epoxy resin composition for semiconductor encapsulation which cures into a cured product that has improved adhesion to the surface of silicon chips and especially photosensitive polyimide resins and nitride films and improved toughness, does not suffer a failure even when the temperature of reflow elevates from the conventional temperature of nearly 240° C. to 260–270° C., does not deteriorate under hot humid conditions as encountered in PCT (120° C./2.1 atm), and does not peel or crack over several hundred cycles of thermal cycling between −65° C. and 150° C. Another object of the invention is to provide a semiconductor device which is encapsulated with a cured product of the liquid epoxy resin composition.

The present invention provides a liquid epoxy resin composition comprising (A) a liquid epoxy resin, (B) an aromatic amine curing agent having a phenolic hydroxyl group in a skeleton, and (C) an inorganic filler. This composition is highly adherent to the surface of silicon chips and especially photosensitive polyimide resins and nitride films, does not deteriorate under hot humid conditions as encountered in PCT (120° C./2.1 atm), and is fully resistant to thermal shocks. The composition is thus suited as an encapsulant for large die size semiconductor devices.

Aromatic amine curing agents are per se known for semiconductor encapsulants as disclosed in Japanese Patent No. 3,238,340 and JP-A 10-158366. As compared with these conventional curing agents, the aromatic amine curing agent having a phenolic hydroxyl group in a skeleton according to the invention enables to formulate an epoxy resin composition which is adherent to the surface of silicon chips and especially photosensitive polyimide resins and nitride films, and significantly resistant to thermal shocks, and maintains satisfactory properties under hot humid conditions. The composition is effective as an encapsulant especially for large die size semiconductor devices.

DESCRIPTION OF THE PREFERRED EMBODIMENTS

Figure 1:
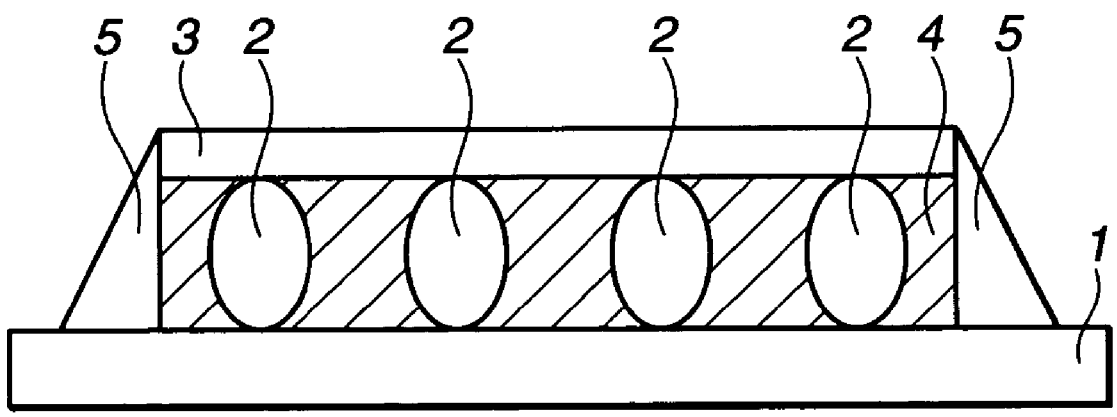
FIG. 1 is a schematic view of a flip chip-type semiconductor device according to one embodiment of the invention.

In the liquid epoxy resin composition of the invention serving as a semiconductor encapsulant, any epoxy resin may be used as the liquid epoxy resin (A) as long as it contains two or less epoxy functional groups in a molecule and is liquid at normal temperature. Preferably the liquid epoxy resin has a viscosity at 25° C. of up to 200 Pa·s, especially up to 50 Pa·s. Useful liquid epoxy resins include bisphenol type epoxy resins such as bisphenol A epoxy resins and bisphenol F epoxy resins, naphthalene type epoxy resins and phenyl glycidyl ether. Of these, epoxy resins which are liquid at room temperature are desirable. It is acceptable to add another epoxy resin of the structure shown below to these liquid epoxy resins insofar as infiltration ability is not compromised.

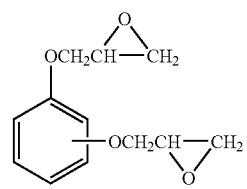

The liquid epoxy resin preferably has a total chlorine content of not more than 1,500 ppm, and especially not more than 1,000 ppm. When chlorine is extracted from the epoxy resin with water at an epoxy resin concentration of 50% and a temperature of 100° C. over a period of 20 hours, the water-extracted chlorine content is preferably not more than 10 ppm. At a total chlorine content of more than 1,500 ppm or a water-extracted chlorine level of more than 10 ppm, the reliability of the sealed semiconductor device, particularly in the presence of moisture, may be compromised.

The aromatic amine curing agent (B) used herein may be of any type as long as it has one or more phenolic hydroxyl groups in a skeleton. Preferably aromatic amine compounds of the general formulae (1) and (2) account for at least 2% by weight, more preferably 5 to 100% by weight, most preferably 10 to 80% by weight of the entire curing agent. If the content of aromatic amine compounds having one or more phenolic hydroxyl groups in their skeleton represented by formulae (1) and (2) is less than 2% by weight based on the entire curing agent, adhesive strength may lower and cracks generate.

Formula (1)

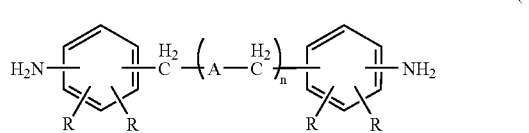

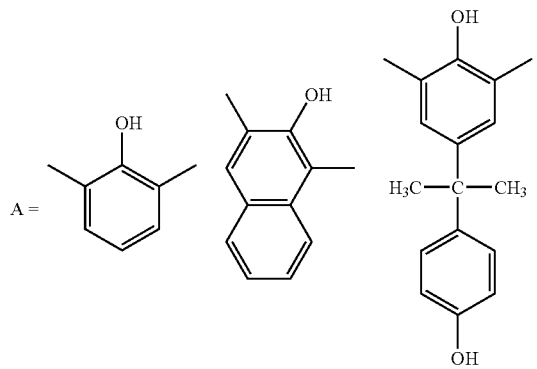

Herein, n is an integer of 1 to 5; R is hydrogen, a halogen atom (e.g., fluorine, bromine and iodine), a $C_{1-8}$ alkyl, alkenyl, alkynyl, trifluoromethyl or phenyl group; and the substituent groups on each aromatic ring may be the same or different.

Formula (2)

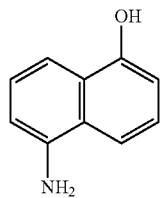

The preferred curing agents other than the foregoing aromatic amine compounds of formulae (1) and (2) include aromatic amine compounds of the general formulae (3) to (5) and low molecular weight aromatic amine compounds such as 2,4-diaminotoluene, 1,4-diaminobenzene, 1,3-diaminobenzene and ethylaminobenzene.

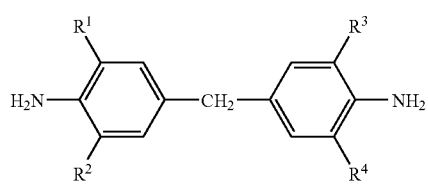

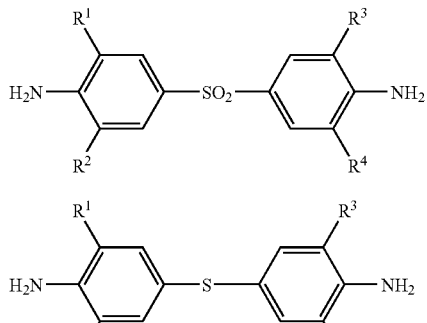

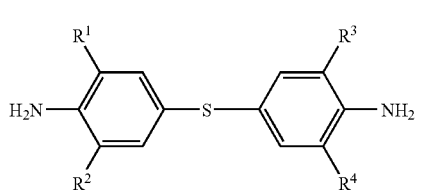

Herein, $R^1$ to $R^4$ are independently hydrogen or monovalent hydrocarbon groups of 1 to 6 carbon atoms. The monovalent hydrocarbon groups represented by $R^1$ to $R^4$ are those of 1 to 6 carbon atoms, preferably 1 to 3 carbon atoms, and examples include alkyl groups such as methyl, ethyl, propyl, isopropyl, butyl, isobutyl, tert-butyl, and hexyl, alkenyl groups such as vinyl, allyl, propenyl, butenyl and hexenyl, aryl groups such as phenyl, and halogenated monovalent hydrocarbon groups in which some or all hydrogen atoms are substituted with halogen atoms (e.g., chlorine, fluorine and bromine), such as fluoromethyl, bromoethyl and trifluoropropyl.

Since the aromatic amine curing agent having a phenolic hydroxyl group in a skeleton is generally solid at normal temperature, direct compounding of the aromatic amine curing agent with the epoxy resin results in a resin compound which has an increased viscosity and is awkward to work. It is then preferred to previously melt and mix the aromatic amine curing agent with the epoxy resin, more preferably in a predetermined proportion (see below) at a temperature in the range of 100 to 200° C. for 0.5 to 2 hours. At a mixing temperature below 100° C., the aromatic amine curing agent may be less compatible with the epoxy resin. A temperature above 200° C. can cause the aromatic amine curing agent to react with the epoxy resin to increase its viscosity. A mixing time of less than 0.5 hour may be insufficient to render the aromatic amine curing agent compatible, inviting a viscosity increase. A time of more than 2 hours may allow the aromatic amine curing agent to react with the epoxy resin to increase its viscosity.

Desirably the total amount of the aromatic amine curing agent used herein should be such that the equivalent ratio of (A) an epoxy equivalent of the liquid epoxy resin to (B) an amine equivalent of the aromatic amine curing agent, (A)/(B), is in the range from 0.7/1 to 1.5/1, preferably from 0.7/1 to 1.2/1, more preferably from 0.7/1 to 1.1/1. If the compounding equivalent ratio is less than 0.7, unreacted amine groups are left, resulting in a lower glass transition temperature and poor adhesion. With an equivalent ratio in excess of 1.5, the toughness $K_{1c}$ value lowers and the cured product becomes hard and brittle enough for cracks to form during the reflow operation.

As the inorganic filler (C) in the inventive composition, any inorganic filler known to be useful for lowering the expansion coefficient may be added. Specific examples include fused silica, crystalline silica, aluminum, alumina, aluminum nitride, boron nitride, silicon nitride, magnesia and magnesium silicate. Of these, spherical fused silica is desirable for achieving low viscosity. The inorganic filler may have been surface treated with a silane coupling agent or the like although the inorganic filler can be used without surface treatment.

When the liquid epoxy resin composition is used as a potting material, the inorganic filler desirably has an average particle size of 2 to 20 μm and a maximum particle size of preferably up to 75 μm, more preferably up to 50 μm. A filler with an average particle size of less than 2 μm may provide an increased viscosity and cannot be loaded in large amounts. An average particle size of more than 20 μm means the inclusion of a more proportion of coarse particles which will catch on lead wires, causing voids.

The amount of the inorganic filler included in the composition is in a range of preferably 100 to 600 parts by weight per 100 parts by weight of the epoxy resin. With less than 100 parts by weight of the filler, the expansion coefficient tends to be too large, which may cause cracks to form in a thermal cycling test. More than 600 parts by weight of the filler increases the viscosity, which may bring about a decline in flow.

When the liquid epoxy resin composition is used as an underfill which should exhibit both improved penetration and a lower linear expansion, it is advantageous to include an inorganic filler having an average particle size at most about one-tenth as large and a maximum particle size at most one-half as large as the size of the flip chip gap (between the substrate and semiconductor chip in a flip chip semiconductor device). In this embodiment, the amount of inorganic filler included in the composition is in a range of preferably 50 to 400 parts by weight, and especially 100 to 250 parts by weight, per 100 parts by weight of the epoxy resin. A composition with less than 50 parts by weight of the filler may have too large an expansion coefficient and crack in a thermal cycling test. A composition with more than 400 parts by weight of the filler may have an increased viscosity, which may interfere with thin-film penetration.

In the liquid epoxy resin composition of the invention, silicone rubbers, silicone oils, liquid polybutadiene rubbers, and thermoplastic resins such as methyl methacrylate-butadiene-styrene copolymers may be included for the stress reduction purpose. Preferably, the stress reducing agent is a silicone-modified resin in the form of a copolymer which is obtained from an alkenyl group-containing epoxy resin or alkenyl group-containing phenolic resin and an organopolysiloxane of the average compositional formula (6) containing per molecule 20 to 400 silicon atoms and 1 to 5 hydrogen atoms each directly attached to a silicon atom (i.e., SiH groups), by effecting addition reaction between alkenyl groups and SiH groups.

Herein $R^5$ is a substituted or unsubstituted monovalent hydrocarbon group, "a" is a number of 0.01 to 0.1, "b" is a number of 1.8 to 2.2, and the sum of a+b is from 1.81 to 2.3.

The monovalent hydrocarbon group represented by $R^5$ preferably has 1 to 10 carbons, and especially 1 to 8 carbons. Illustrative examples include alkyl groups such as methyl, ethyl, propyl, isopropyl, butyl, isobutyl, tert-butyl, hexyl, octyl and decyl; alkenyl groups such as vinyl, allyl, propenyl, butenyl and hexenyl; aryl groups such as phenyl, xylyl and tolyl; aralkyl groups such as benzyl, phenylethyl and phenylpropyl; and halogenated monovalent hydrocarbon groups in which some or all of the hydrogen atoms on the hydrocarbon groups are substituted with halogen atoms (e.g., chlorine, fluorine, bromine), such as fluoromethyl, bromoethyl and trifluoropropyl.

Copolymers having the following structure are preferred.

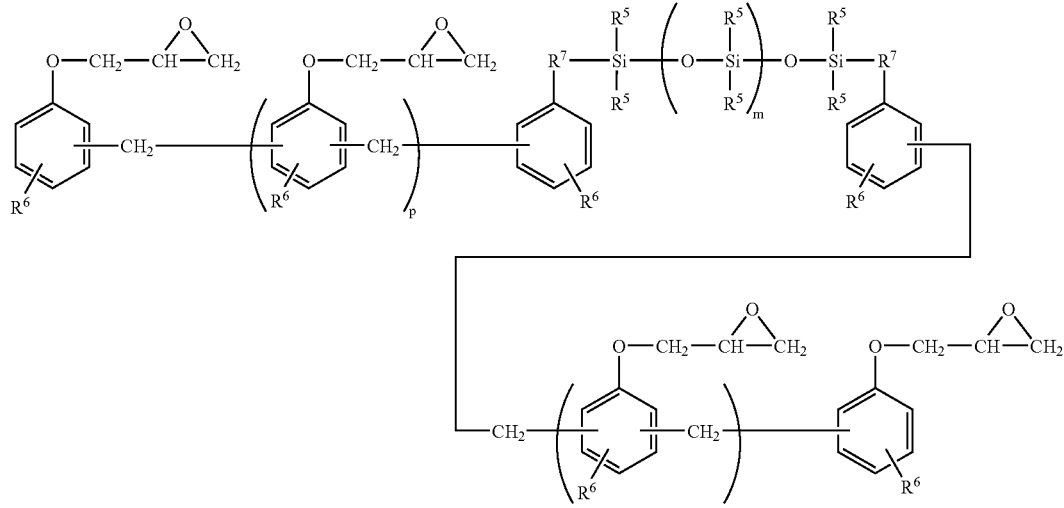

In the above formula, $R^5$ is as defined above, $R^6$ is a hydrogen atom or an alkyl of 1 to 4 carbons, and $R^7$ is —CH$_2$CH$_2$CH$_2$—, —OCH$_2$—CH(OH)—CH$_2$—O—CH$_2$CH$_2$CH$_2$— or —O—CH$_2$CH$_2$CH$_2$—. The letter m is an integer from 4 to 199, and preferably from 19 to 99, p is an integer from 1 to 10, and q is an integer from 1 to 10.

The above-described copolymer is included in the inventive composition such that the amount of diorganopolysiloxane units is 0 to 20 parts by weight, and preferably 2 to 15 parts by weight, per 100 parts by weight of the epoxy resin, whereby stress can be further reduced.

If necessary, the liquid epoxy resin composition may further contain other additives as long as they do not compromise the objects of the invention. Suitable additives include curing accelerators, carbon-functional silanes for improving adhesion, pigments (e.g., carbon black), dyes, and antioxidants.

The liquid epoxy resin composition of the invention may be prepared by the simultaneous or discrete agitation, melting, mixing and dispersion of the liquid epoxy resin, aromatic amine curing agent and inorganic filler as well as optional additives, while carrying out heat treatment if necessary. No particular limitation is imposed on the apparatus used for mixing, agitating, dispersing and otherwise processing the mixture of components. Exemplary apparatus suitable for this purpose include an automated mortar, three-roll mill, ball mill and planetary mixer. Use can also be made of suitable combinations of these apparatuses.

The liquid epoxy resin composition for use as a sealant or encapsulant should desirably have a viscosity of up to 1,000 Pa·s at 25° C.

An ordinary molding method and ordinary molding conditions may be employed when encapsulating semiconductor devices with the inventive composition. It is preferable to carry out an initial hot oven cure at about 100 to 120° C. for at least about 0.5 hour, followed by a subsequent hot oven cure at about 150° C. for at least about 0.5 hour. If heating at 100–120° C. is less than 0.5 hour, voids may form after curing. If heating at 150° C. is less than 0.5 hour, cured properties may become insufficient.

The semiconductor devices to be encapsulated with the inventive composition are typically flip chip-type semiconductor devices. Referring to FIG. 1, the flip chip-type semiconductor device includes an organic substrate 1 having an interconnect pattern side on which is mounted a semiconductor chip 3 over a plurality of intervening bumps 2. The gap between the organic substrate 1 and the semiconductor chip 3 (shown in the diagram as gaps between the bumps 2) is filled with an underfill material 4, and the lateral edges of the gap and the periphery of semiconductor chip 3 are sealed with a fillet material 5. The inventive liquid epoxy resin composition is especially effective for use as the underfill.

When the inventive composition is used as an underfill material, the cured product preferably has an expansion coefficient of 20 to 40 ppm/° C. below the glass transition temperature (Tg). Sealant used as the fillet material may be a conventional material known to the art. A liquid epoxy resin composition of the same type as that for underfill may also be used as the fillet although the cured product in this case preferably has an expansion coefficient of 10 to 20 ppm/° C. below the Tg.

EXAMPLE

Examples of the invention and comparative examples are given below by way of illustration, and are not intended to limit the invention.

Examples 1–5 and Comparative Examples 1–2

The components shown in Table 1 were mixed to uniformity on a three-roll mill to give seven resin compositions. These resin compositions were examined by the following tests. The results are also shown in Table 1.

Viscosity

The viscosity at 25° C. was measured using a BH-type rotary viscometer at a rotational speed of 4 rpm.

Glass Transition Temperature (Tg)

Using a sample of the cured composition measuring 5×5×15 mm, the glass transition temperature was measured with a thermomechanical analyzer at a heating rate of 5° C./min.

Coefficients of Thermal Expansion (CTE)

Based on the Tg measurement described above, a coefficient of thermal expansion below Tg (CTE-1) was determined for a temperature range of 50 to 80° C., and a coefficient of thermal expansion above Tg (CTE-2) was determined for a temperature range of 200 to 230° C.

Bond Strength Test

On a $Si_3N_4$-coated silicon chip was rested a frustoconical sample having a top diameter of 2 mm, a bottom diameter of 5 mm and a height of 3 mm. It was cured at 150° C. for 3 hours. At the end of curing, the sample was measured for (initial) shear bond strength. The cured sample was then placed in a pressure cooker test (PCT) environment of 121° C. and 2.1 atm for 336 hours for moisture absorption. At the end of PCT test, shear bond strength was measured again. In each Example, five samples were used, from which an average bond strength value was calculated.

PCT Peel Test

A $Si_3N_4$-coated 10×10 mm silicon chip was stacked on a 30×30 mm FR-4 substrate using spacers of approximately 100 μm thick, leaving a gap therebetween. An epoxy resin composition was introduced into the gap and cured thereat. The assembly was held at 30° C. and RH 65% for 192 hours and then processed 5 times by IR reflow set at a maximum temperature of 265° C., before the assembly was checked for peeling. The assembly was then placed in a PCT environment of 121° C. and 2.1 atm for 336 hours, before the assembly was checked for peeling. Peeling was inspected by C-SAM (SONIX Inc.).

Thermal Shock Test

A $Si_3N_4$-coated 10×10 mm silicon chip was stacked on a 30×30 mm FR-4 substrate using spacers of approximately 100 μm thick, leaving a gap therebetween. An epoxy resin composition was introduced into the gap and cured thereat. The assembly was held at 30° C. and RH 65% for 192 hours and then processed 5 times by IR reflow set at a maximum temperature of 265° C. The assembly was then tested by thermal cycling between −65° C./30 minutes and 150° C./30 minutes. After 250, 500 and 750 cycles, the assembly was examined for peeling and cracks.

TABLE 1

| Component (pbw) | Example | | | | | Comparative Example | |
|---|---|---|---|---|---|---|---|
| | 1 | 2 | 3 | 4 | 5 | 1 | 2 |
| C-300S | 16 | 25 | 17 | 20 | 20 | 0 | 30 |
| Diamine-1 | 16 | 5 | 0 | 0 | 10 | 0 | 0 |

TABLE 1-continued

| Component (pbw) | Example 1 | Example 2 | Example 3 | Example 4 | Example 5 | Comparative Example 1 | Comparative Example 2 |
|---|---|---|---|---|---|---|---|
| Diamine-2 | 0 | 0 | 17 | 0 | 0 | 0 | 0 |
| Diamine-3 | 0 | 0 | 0 | 10 | 0 | 0 | 0 |
| Phenyl glycidyl ether | 5 | 5 | 5 | 5 | 15 | 0 | 5 |
| RE303S-L | 64 | 64 | 63 | 64 | 50 | 40 | 63 |
| YH307 | 0 | 0 | 0 | 0 | 0 | 66 | 0 |
| Spherical silica | 150 | 150 | 150 | 150 | 150 | 150 | 150 |
| KBM403 | 1.0 | 1.0 | 1.0 | 1.0 | 1.0 | 1.0 | 1.0 |
| Copolymer | 4 | 4 | 4 | 4 | 4 | 4 | 4 |
| 2E4MZ | 0 | 0 | 0 | 0 | 0 | 2 | 0 |
| Epoxy resin/amine curing agent (equivalent ratio) | 1.0 | 1.0 | 1.0 | 1.0 | 1.0 | — | 1.0 |
| Measurement results | | | | | | | |
| Viscosity at 25° C. (Pa·s) | 155 | 89 | 176 | 92.5 | 88 | 28.4 | 74.3 |
| Tg (° C.) | 115 | 112 | 110 | 115 | 119 | 140 | 118 |
| CTE-1 (ppm/° C.) | 35 | 36 | 37 | 33 | 31 | 31 | 35 |
| CTE-2 (ppm/° C.) | 119 | 125 | 119 | 121 | 125 | 123 | 125 |
| PCT peel test — After 5 times of IR reflow at 265° C. | no peeling | no peeling | no peeling | no peeling | no peeling | peeled | no peeling |
| PCT peel test — After PCT 336 hr | no peeling | no peeling | no peeling | no peeling | no peeling | peeled | peeled |
| Bond strength (kgf/cm²) Initial | 216 | 168 | 175 | 173 | 163 | 69 | 112 |
| Bond strength (kgf/cm²) After PCT 336 hr | 156 | 145 | 141 | 132 | 119 | 35 | 68 |
| Failure (%) after thermal shock test 250 cycles | 0 | 0 | 0 | 0 | 0 | 100 | 0 |
| Failure (%) after thermal shock test 500 cycles | 0 | 0 | 0 | 0 | 0 | — | 0 |
| Failure (%) after thermal shock test 750 cycles | 0 | 0 | 0 | 0 | 5 | — | 50 |

Components:

C-300S: tetraethyldiaminophenylmethane, Nippon Kayaku Co., Ltd.

Diamine-1

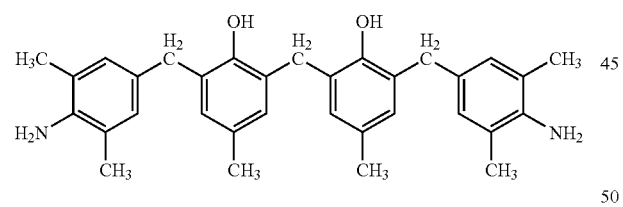

C$_{39}$H$_{38}$N$_2$O$_2$

Exact Mass: 566.29, Mol. Wt.: 566.73,
C, 82.65; H, 6.76; N, 4.94; O, 5.65

Diamine-2

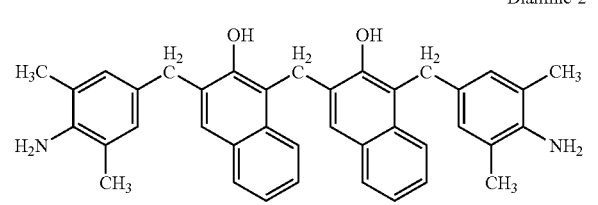

C$_{39}$H$_{38}$N$_2$O$_2$

Exact Mass: 566.29, Mol. Wt.: 566.73,
C, 82.65; H, 6.76; N, 4.94; O, 5.65

Diamine-3

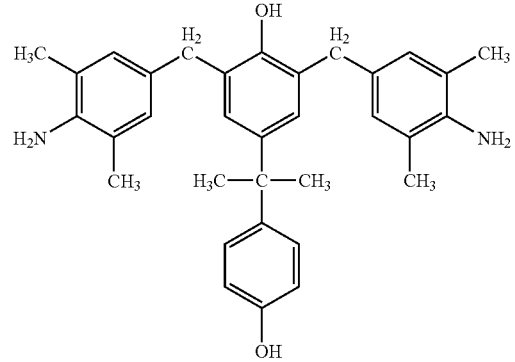

C$_{33}$H$_{38}$N$_2$O$_2$

Exact Mass: 496.31, Mol. Wt.: 496.68,
C, 79.80; H, 8.12; N, 5.64; O, 6.44

RE303S-L: bisphenol F-type epoxy resin, Nippon Kayaku Co., Ltd.

YH307: a mixture of 3,4-dimethyl-6-(2-methyl-1-propenyl)-1,2,3,6-tetrahydrophthalic acid and 1-isopropyl-4- methylbicyclo[2.2.2]oct-5-ene-2,3-dicarboxylic acid in a weight ratio of 6/4, Japan Epoxy Resins Co., Ltd.

KBM403: silane coupling agent, γ-glycidoxypropyltrimethoxysilane, Shin-Etsu Chemical Co., Ltd.

2E4MZ: 2-ethyl-4-methylimidazole, Shikoku Chemicals Co., Ltd.

Spherical silica: spherical silica having a maximum particle size of up to 24 μm and an average particle size of 6 μm Copolymer: the addition reaction product of

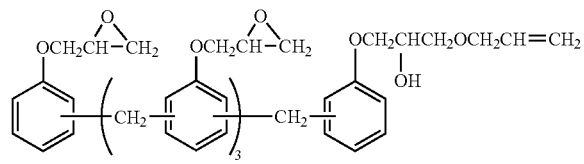

and

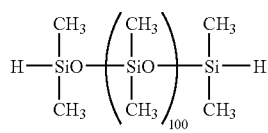

It has been demonstrated that the liquid epoxy resin composition of the invention cures into a product which has improved adhesion to the surface of silicon chips and especially to photosensitive polyimide resins and nitride films, and offers an encapsulated semiconductor device that does not suffer a failure even when the temperature of reflow after moisture absorption elevates from the conventional temperature of nearly 240° C. to 260–270° C., does not deteriorate under hot humid conditions as encountered in PCT (120° C./2.1 atm), and does not undergo peeling or cracking over several hundred cycles of thermal cycling between −65° C. and 150° C. The composition is thus best suited as an encapsulant for semiconductor devices.

Japanese Patent Application No. 2002-268755 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A liquid epoxy resin composition comprising
   (A) a liquid epoxy resin,
   (B) an aromatic amine curing agent selected from the group consisting of compounds of Formula (1) and Formula (2)

Formula (1)
   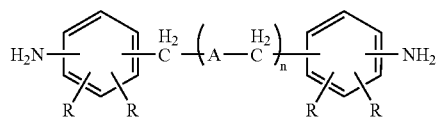

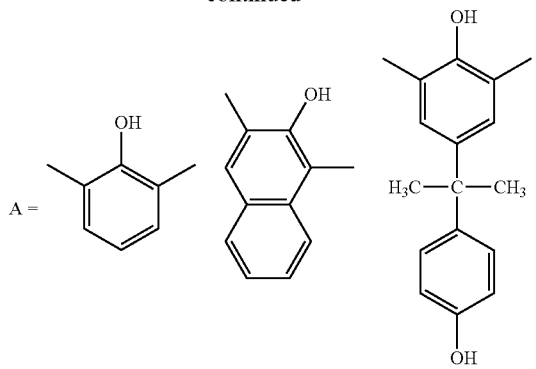

or

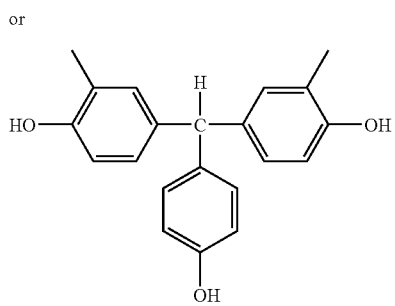

wherein "n" is an integer of 1 to 5 and "R" is hydrogen, halogen, $C_{1-8}$-alkyl, $C_{1-8}$-alkenyl, $C_{1-8}$-alkynyl, trifluoromethyl, or phenyl and the substituent groups on each aromatic ring may be the same or different Formula (2)
   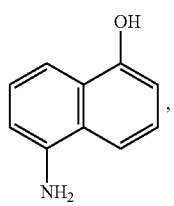

(C) an inorganic filler.

2. The composition of claim 1, further comprising
   (D) a silicone-modified resin in the form of a copolymer which is obtained from an alkenyl group-containing epoxy resin or phenolic resin and an organopolysiloxane having the average compositional formula (6):

$$H_a R^5_b SiO_{(4-a-b)/2} \quad (6)$$

wherein $R^5$ is a substituted or unsubstituted monovalent hydrocarbon group, "a" is a number of 0.01 to 0.1, "b" is a number of 1.8 to 2.2, and $1.81 \leq a+b \leq 2.3$, said organopolysiloxane containing per molecule 20 to 400 silicon atoms and 1 to 5 hydrogen atoms each directly attached to a silicon atom (i.e., SiH groups), by effecting addition reaction between alkenyl groups and SiH groups.

3. A semiconductor device which is encapsulated with the liquid epoxy resin composition of claim 1 in the cured state.

4. A flip chip type semiconductor device which is encapsulated with the liquid epoxy resin composition of claim 1 in the cured state as an underfill.

5. The liquid epoxy resin composition of claim 1, wherein component (A) is a bisphenol F epoxy resin and component (C) is spherical silica.

6. The liquid epoxy resin composition of claim 5, further comprising (B) a diamine of the formula

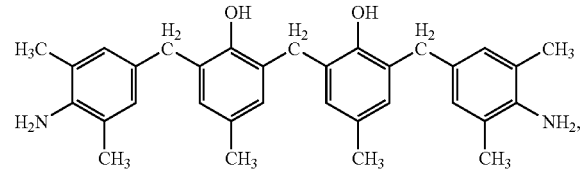

phenyl glycidyl ether, γ-glycidoxypropyltrimethoxysilane, and a copolymer addition reaction product of

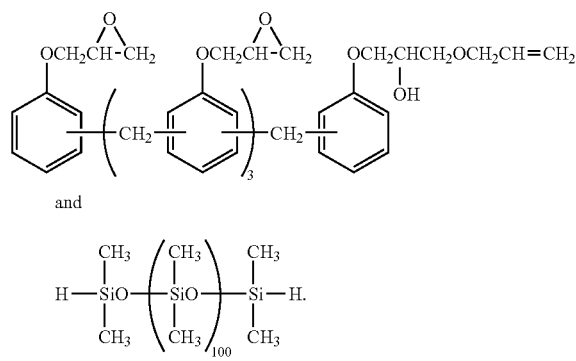

* * * * *